United States Patent [19]

Dueber et al.

[11] Patent Number: 4,555,473

[45] Date of Patent: Nov. 26, 1985

[54] ALKALI DEVELOPABLE PHOTOPOLYMER CRYSTALLINE COMPOSITION

[75] Inventors: Thomas E. Dueber; William J. Nebe, both of Wilmington, Del.

[73] Assignee: E. I. DuPont de Nemours and Company, Wilmington, Del.

[21] Appl. No.: 678,884

[22] Filed: Dec. 6, 1984

[51] Int. Cl.$^4$ ............................................. G03C 1/68
[52] U.S. Cl. .................................... 430/281; 430/270; 430/910; 430/920; 204/159.15; 204/159.16
[58] Field of Search ............... 430/281, 910, 270, 920; 204/159.15, 159.16

[56] References Cited

U.S. PATENT DOCUMENTS

| | | | |
|---|---|---|---|
| 3,795,520 | 3/1974 | Nebe | 96/115 P |
| 3,871,885 | 3/1975 | Hertler | 96/115 P |
| 3,887,450 | 6/1975 | Gilano et al. | 430/910 |
| 3,930,865 | 1/1976 | Faust et al. | 430/910 |
| 4,186,067 | 1/1980 | Muzyczko et al. | 430/281 |
| 4,245,030 | 1/1981 | Faust et al. | 430/281 |
| 4,273,857 | 6/1981 | Leberzammer et al. | 430/910 |
| 4,361,640 | 11/1982 | Pine | 430/910 |
| 4,465,572 | 8/1984 | Graham | 430/910 |
| 4,485,167 | 11/1984 | Briney et al. | 430/910 |

OTHER PUBLICATIONS

Hertler et al., Crystalline Matric Photoimaging, Photographic Science and Engineering, 23, No. 5, Sep./Oct. 1979.

*Primary Examiner*—Jack P. Brammer

[57] ABSTRACT

Photopolymerizable crystalline composition having a crystallinity index of at least 0.2 which comprises: (a) at least one ethylenically unsaturated monomer, (b) at least one photoinitiator, (c) at least one acidic polymeric binder and (d) a crystalline matrix forming compound having a melting point of 50° to 200° C. The compositions are useful in film form as photoresists, litho films, etc.

10 Claims, No Drawings

ALKALI DEVELOPABLE PHOTOPOLYMER CRYSTALLINE COMPOSITION

DESCRIPTION

1. TECHNICAL FIELD

This invention relates to alkali developable photopolymerizable compositions. More particularly, this invention relates to alkali developable photopolymerizable compositions with a crystalline matrix forming compound.

2. BACKGROUND ART

Photopolymerizable compositions, e.g., those containing an ethylenically unsaturated compound, photoinitiator and polymeric binder, are becoming increasingly popular for a variety of uses. One important use is in the preparation of printed circuits. Photopolymerizable compositions in film form sandwiched between a removable support and removable cover sheet are used as dry film photoresists in processes described in Celeste U.S. Pat. No. 3,469,982. The photoresists described by Celeste are soluble in organic solvents. More recently photoresists that are soluble in aqueous solutions, e.g., aqueous alkaline solutions, are becoming more popular due primarily to the ecological benefits resulting from the use of such aqueous alkaline developers. The commonly used photopolymer photoresists, while advantageous in many ways, are constantly in need of improvement due to intense commercial competition. Areas of improvement include: exposure speed, oxygen insensitivity and development latitude.

Hertler U.S. Pat. No. 3,871,885 describes photopolymerizable compositions which are predominantly crystalline in nature that contain ethylenically unsaturated monomers and an organic, light-sensitive free radical generating system. In film form the crystalline films of Hertler have higher speed, due to having less oxygen sensitivity, than the conventional photopolymer films described above. The Hertler compositions which are described as being useful as photoresists do not contain an organic polymeric binder, e.g., see column 1, lines 37 to 55, and column 4, lines 12 to 14, of Hertler U.S. Pat. No. 3,871,885. While exhibiting certain advantages over conventional photopolymer film resists, the Hertler crystalline compositions, have been found to have some disadvantages when used as photoresists and for other uses requiring imagewise exposure to actinic radiation sources. For example, the Hertler compositions are developable in organic solvents and the methods of applying the compositions to a support are restricted.

It is therefore desirable to provide photopolymerizable crystalline compositions which provide practical photopolymerizable compositions possessing aqueous alkaline processability as well as improved exposure speed and development latitude, and lower oxygen sensitivity than conventional photopolymerizable compositions. It is further desirable that such photopolymerizable compositions be achieved with as little change as possible in the known photopolymerizable compositions.

DISCLOSURE OF THE INVENTION

In accordance with this invention there is provided a photopolymerizable crystalline composition having a crystallinity index of at least 0.2. consisting essentially of (a) at least one ethylenically unsaturated compound;
(b) at least one photoinitiator or photoinitiator system;
(c) at least one acidic polymeric binder; and
(d) a crystalline matrix forming compound having a melting point in the range of 50° to 200° C.

Useful additives in the photopolymerizable crystalline composition include: inhibitors, leuco dyes, accelerators or reducing agents such as oxygen scavengers and chain transfer agents, and inert components, e.g., plasticizers, dyes and pigments, fillers, etc. The phrase "consisting essentially of" used with respect to the composition means unspecified components, which do not prevent the advantages of the invention from being realized, are not excluded.

The ethylenically unsaturated compound (a) can be present in the photopolymerizable crystalline composition in an amount of 10 to 40% by weight, preferably 15 to 30% by weight. The photoinitiator or photoinitiator system can be present in initiating amounts which can be relatively small, e.g., 0.05% by weight. An initiator such as hexaarylbiimidazole can be present in an amount of 0.1 to 10% by weight. The amount of other photoinitiators, e.g., Michler's ketone, indanone compound disclosed in Examples 3 to 5, and other photoinitiators described below, depends on the thickness of the film. For thicker films (0.025 to 0.127 mm range) an optical density of about 0.43 in the actinic region of the photopolymerizable composition is desirable. For thinner films higher concentrations of photoinitiator may be required. The acidic polymeric binder (c) can be present in 20 to 40% by weight, preferably 30% by weight. The crystalline matrix component (d) can be present in an amount of 20 to 50% by weight, preferably 25 to 45% by weight depending on the particular acidic polymeric binder and alkaline aqueous developer. The percentages by weight are based on the total weight of solids of the composition.

The ethylenically unsaturated compounds (a) (photopolymerizable monomers of this invention) have a boiling point above 100° C. at normal atmospheric pressure and preferably are capable of forming a high molecular weight polymer by photoinitiated, addition polymerization. Suitable compounds are disclosed in Chang Reissue No. 28,789 (U.S. Pat. No. 3,756,827) column 2, line 30 to column 3, line 25, the disclosure of which is incorporated herein by reference. Other useful monomers include ethylenically unsaturated diester polyhydroxy polyethers as described in Chambers U.S. Pat. No. 4,245,031. Examples include the Epocryl ® resins sold by Shell Chemical Co. Many of the polymerizable monomers are subject to thermal polymerization, especially when stored for long periods or at elevated temperatures. When such compounds are supplied commercially, it is customary for them to contain a small, but effective, amount of a thermal polymerization inhibitor. These inhibitors may be left in the monomers when the photopolymerizable coating compositions of this invention are prepared. The resulting compositions usually have satisfactory thermal stability. If unusual thermal exposure is anticipated, or if monomers containing little or no thermal polymerization inhibitor are employed, compositions with adequate shelf life can be obtained by incorporating, e.g., up to 0.5 percent, by weight of monomer, of a thermal polymerization inhibitor such as hydroquinone, methylhydroquinone, p-methoxyphenol, etc. Preferred ethylenically unsaturated compounds are tetraethylene glycol dimethacrylate and trimethylolpropane triacrylate.

At least one photoinitiator (b) is present in the photopolymerizable compositions. Useful photoinitiator types include: hexaarylbiimidazoles which are preferred, p-aminophenyl ketones, quinones, alkylaryl ketones, benzophenones, 4-trichloromethyl-4-methyl-2,5-cyclohexadienones, arylylidene aryl ketones, and mixtures thereof, e.g., Michler's ketone with a benzophenone or hexaarylbiimidazole. The hexaarylbiimidazoles are photodissociable to the corresponding triarylimidazolyl radicals. These hexaarylbiimidazoles absorb maximally in the 255-275 nm region, and usually show some, though lesser absorption in the 300-375 nm region. Although the absorption bands tend to tail out to include wavelengths as high as about 430 nm, they normally require light rich in the 255-375 nm wavelengths for their dissociation.

The hexaarylbiimidazoles can be represented by the formula:

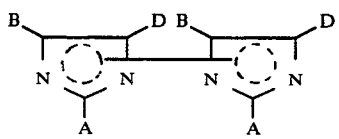

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical or with the oxidation of a leuco dye that may be present, and each dotted circle stands for four delocalized electrons (i.e., two conjugated double bonds) which satisfy the valences of the carbon and nitrogen atoms of the imidazolyl ring. The B and D aryl groups can each be substituted with 0-3 substituents and the A aryl groups can be substituted with 0-4 substituents. Useful 2,4,5-triarylimidazolyl dimers are disclosed in Baum and Henry U.S. Pat. No. 3,652,275, column 5, line 44 to column 7, line 16, the disclosure of which is incorporated herein by reference. p-aminophenyl ketones are disclosed in Fishman U.S. Pat. No. 3,552,973, column 3, line 40 to column 4, line 10, the disclosure of which is incorporated herein by reference.

Useful quinone types are: camphorquinone, substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, 1,2,3,4-tetrahydronaphthacenequinone, and 1,2,3,4-tetrahydrobenz(a)anthracene-7,12-dione.

Useful alkylaryl ketones include: vicinal ketaldonyl alcohols such as benzoin, pivaloin, acyloin ethers, e.g., benzoin methyl ether, benzoin ethyl ether, benzoin isopropyl ether, benzoin phenyl ether, benzoin t-butyl ether, benzoin sec-butyl ether, benzoin isobutyl ether, benzoin n-butyl ether; α-hydrocarbon-substituted aromatic acyloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Useful benzophenones include: benzophenone, 4,4'-dichlorobenzophenone, fluorenone, anthrone, thioxanthenone, xanthenone, 4-dimethylaminobenzophenone, 4-morpholinobenzophenone.

4-Trichloromethyl-4-methyl-2,5-cyclohexadienone compounds useful in this invention are disclosed in Sysak U.S. Pat. No. 4,341,860, the disclosure of which is incorporated herein by reference. Useful such compounds include:
4-methyl-4-trichloromethyl-2,5-cyclohexadienone
2,6-dimethyl-4-trichloromethyl-2,5-cyclohexadienone
3,4-dimethyl-4-trichloromethyl-2,5-cyclohexadienone
4-nonyl-4-trichloromethyl-2,5-cyclohexadienone
4-trichloromethyl-3,4,5-trimethyl-2,5-cyclohexadienone
2,6-di-(t-butyl)-4-trichloromethyl-2,5-cyclohexadienone
2,6-di(t-butyl)-4-methyl-4-trichloromethyl-2,5-cyclohexadienone
2,6-dichloro-4-methyl-4-trichloromethyl-2,5-cyclohexadienone
2,6-dibromo-4-methyl-4-trichloromethyl-2,5-cyclohexadienone
2,4-dimethyl-4-trichloromethyl-2,5-cyclohexadienone
4-trichloromethyl-2,4,5-trimethyl-2,5-cyclohexadienone
4-phenyl-4-trichloromethyl-2,5-cyclohexadienone
2-methoxy-4-methyl-4-trichloromethyl-2,5-cyclohexadienone
2,6-dimethoxy-4-methyl-4-trichloromethyl-2,5-cyclohexadienone
2,3-benzo-4-methyl-4-trichloromethyl-2,5-cyclohexadienone
2,4,6-tri(t-butyl)-4-trichloromethyl-2,5-cyclohexadienone
4-trichloromethyl-2,4,6-trimethyl-2,5-cyclohexadienone
4-t-butyl-4-trichloromethyl-2,5-cyclohexadienone
2,3,4,5,6-pentamethyl-4-trichloromethyl-2,5-cyclohexadienone
2,4,6-tri(t-pentyl)-4-trichloromethyl-2,5cyclohexadienone
4-benzyl-4-trichloromethyl-2,5-cyclohexadienone
2-t-butyl-4-trichloromethyl-2,5-cyclohexadienone
2-i-propyl-4-methyl-4-trichloromethyl-2,5-cyclohexadienone
2-t-butyl-4-methyl-4-trichloromethyl-2,5-cyclohexadienone
2-ethyl-4,5-dimethyl-4-trichloromethyl-2,5-cyclohexadienone
2,3-benzo-4,5-dimethyl-4-trichloromethyl-2,5-cyclohexadienone Additional useful compounds are similarly substituted -4-dichloromethyl-2,5-cyclohexadienones as those described above.

Useful arylylidene aryl ketone sensitizers are described in Dueber U.S. Pat. No. 4,162,162, column 4, line 58 to column 6, line 65, the disclosure of which is incorporated herein by reference. A preferred arylylidene aryl ketone compound is 2-(9'-julolylidene)-5,6-dimethoxy-1-indanone.

The polymeric binder (c) is selected so that the unexposed photopolymerizable coating is soluble in predominantly aqueous solutions, for example dilute aqueous alkaline solutions, but upon exposure to actinic radiation becomes relatively insoluble therein. Useful acidic polymeric binders include: carboxylated polymers, e.g., vinyl addition polymers containing free carboxylic acid groups as disclosed in Alles U.S. Pat. No. 3,458,311, Leberzammer and Roos U.S. Pat. No. 4,273,857 and Flint and Pilette U.S. Pat. No. 4,293,635 (see particularly column 3, lines 13 to 32), the disclosures of which are incorporated herein by reference. Preferred acidic polymeric binders are shown in the examples below, e.g., pentapolymer of octylacrylamide(40%)/methyl methacrylate(35%)/acrylic acid(16%)/hydroxypropyl methacrylate(5%)/t-butylaminoethyl methacrylate(4%), acid number 118, $\overline{M}_w$ 50,000, Tg about 120° C.; terpolymer of ethyl acrylate(71%)/methyl methacrylate(17%)/acrylic acid (12%), $\overline{M}_w$ 150,000; copolymer of 1:1 styrene/maleic anhydride partially esterified with isobutanol mixture, acid no. 190, $\overline{M}_w$ 10,000; terpolymer of methyl methacrylate(70%)/2-ethylhexyl acrylate (11%)/acrylic acid(19%), acid no. 123; terpolymer of methyl methacrylate(55%)/ethyl acrylate(35%)/acrylic acid(10%); $\overline{M}_w$ 50,000; terpolymer of methyl methacrylate(48%)/ethyl acrylate(27%)/methacrylic acid(25%), acid no. 170, Tg 75° C.; a combination of a copolymer of styrene/maleic anhydride and a terpolymer of ethyl acrylate/methyl methacrylate/acrylic acid. Another preferred group of binders includes polyacrylate esters and poly-α-alkylacrylate esters, particularly polymethyl methacrylate.

The crystalline matrix forming compounds useful in the photopolymerizable crystalline composition have melting points in the range of 50 to 200° C. The crystalline matrix forming compounds are disclosed in Hertler U.S. Pat. No. 3,871,885, column 16, lines 15 to 32, the disclosure of which is incorporated herein by reference. Specific crystalline matrix forming compounds include: bibenzyl, biphenyl, pentamethylbenzene, 1,4-diethoxybenzene, 1,2-diphenoxyethane, octahydroanthracene, docosane, octacosane, dotriacontane. Preferred crystalline matrix forming compounds are 1,2-diphenoxyethane and pentamethylbenzene.

The crystallinity index of the compositions of the invention should be at least 0.2, the upper limit ranging to infinity, and can be determined by the procedure set forth in H. P. Klug and L. E. Alexander, "X-Ray Diffraction Procedures," John Wiley & Sons, Inc., New York (1954), pp. 626–630. The indix is computed from X-ray diffraction powder method data in the form of a scintillation counter intensity versus 2θ graph obtained from a diffractometer where θ is the Bragg angle. The basic idea is that of comparing the diffracted energy of the Bragg reflections (above the line I) to that of the noncrystalline scattering (below the line I). A typical diffractometer graph is shown in FIG. 1 of Hertler U.S. Pat. No. 3,871,885.

The discrete Bragg reflections such as A, B and C, etc. are superimposed on a broad background line I. The Bragg reflections are those peaks which have a width at half-height less than 1° in θ, thus excluding the very broad peaks which may be due to one or two dimensional order. The crystallinity index is defined as the area B under all of the Bragg reflections, but above the line I, divided by the area A under the line I, or $$X_c = B/A$$

Bragg reflections due to the aluminum substrate, such as i and ii in FIG. 1 of Hertler U.S. Pat. No. 3,871,885, are not to be considered in computing $X_c$. In computing these areas, the background radiation is to be excluded from consideration. For example the base line of the recorder can be adjusted so that it reads zero intensity with the X-ray source turned off.

To make the above calculation for $X_c$, the experimental stepup must be as follows:

X-ray diffractometer—Norelco Model No. 2
Sample thickness—10–1000 μm
Substrate—aluminum plate
Diffraction conditions:
  Tube voltage—40 kv.
  Tube current—35 ma.
Time constant—2 seconds or less
Radiation—CuK$_a$
Traverse speed—2°/minute
Monochromator—LiF curved crystal
Detector—Scintillation Counter, PHA, Hamner.

Optionally, leuco dyes can also be present in the photopolymerizable crystalline composition. By the term "leuco dye" is meant the colorless (i.e., the reduced) form of a dye compound which can be oxidized to its colored form by the triarylimidazolyl radical. Leuco dyes are disclosed in Baum and Henry U.S. Pat. No. 3,652,275, column 7, line 24 to column 11, line 32, the disclosure of which is incorporated herein by reference.

Accelerators or reducing agents such as oxygen scavengers and active hydrogen donors acting as chain transfer agents are useful additions to compositions to improve photospeed. Oxygen scavengers that have been found to be useful are phosphines, phosphites, stannous salts and other compounds that are easily oxidized by oxygen. Useful chain transfer agents are N-phenyl glycine, trimethylbarbituric acid, 2-mercaptobenzoxazole, 2-mercaptobenzothiazole, and other compounds that have hydrogens that are readily abstractable by radicals.

A wide range of nonpolymerizable plasticizers are effective in achieving improved exposure and development temperature latitude. Selection of a suitable plasticizer is determined by compatibility with other components of the photopolymerizable crystalline composition, particularly the binder, monomer and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyester of poly-α-methylstyrenes; chlorinated paraffins; and sulfonamide types may be used. In general, water insoluble plasticizers are preferred for greater high humidity storage stability, but are not necessary to get improved latitude. Other inert additives such as dyes, pigments and fillers are known to those skilled in the art. Dyes and pigments are generally present in minor amounts. The additives should not interfere with the exposure of the photopolymerizable layer.

The photopolymerizable crystalline compositions described herein may be coated or laminated on a wide variety of substrates. By "substrate" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, alumina-blasted polyethylene terephthalate film, polyethylene terephthalate film, e.g., resin-subbed polyethylene terephthalate film, flame or electrostatic discharge treated polyethylene terephthalate film, polyvinyl alcohol-coated paper, crosslinked polyester-coated paper, nylon, glass, cellulose acetate film, heavy paper such as lithographic paper, and the like. The particular substrate will generally be determined by the use application involved. For example, when printed circuits are produced, the substrate may be a plate which is a copper coating on fiberboard.

Preferably a layer of the photopolymerizable crystalline composition has a thickness ranging from about 0.0001 inch (~ ~0.0003 cm) to about 0.01 inch (0.025 cm) and is adhered with low to moderate adherence to a thin, flexible, polymeric film support which may transmit radiation actinic to the photopolymerizable layer. The opposite side of the photopolymerizable layer may have adhered thereto a protective cover layer or cover sheet wherein the sheet has less adherence to the layer than the adherence between the film support and the layer. Preferred supports are a transparent polyethylene terephthalate film having a thickness of about 0.001 inch (~0.0025 cm) and a copper support. Polyethylene, 0.001 inch (~0.0025 cm) is a preferred cover sheet; polyvinyl alcohol coating is a preferred cover layer.

Any convenient source of actinic radiation providing wavelengths in the region of the spectrum that overlap the absorption bands of the photoinitiator and sensitizer present can be used to activate the photopolymerizable crystalline compositions for radical formation, photopolymerization initiation and image formation. The light can be natural or artificial, monochromatic or polychromatic, incoherent or coherent, and for high efficiency should correspond closely in wavelengths to the principal absorption bands and should be sufficiently intense to activate a substantial proportion of the photoinitiator and sensitizer, if one is present.

Conventional light sources include fluorescent lamps, mercury, metal additive, pulsed xenon, and arc lamps providing narrow or broad light bands centered near 405, 436 and 546 nm (Hg) wavelengths. Coherent light sources are the pulsed xenon chloride, argon ion, and ionized neon-lasers. Visible emitting cathode ray tubes widely useful in printout systems for writing on photosensitive materials are also useful with the subject compositions. These in general involve an ultraviolet or visible-emitting phosphor internal coating as the means for converting electrical energy to light energy and a fiber optic face plate as the means for directing the radiation to the photosensitive target.

A preferred mode is illustrated in Example 2.

INDUSTRIAL APPLICABILITY

The photopolymerizable crystalline compositions of this invention are useful in photoresists in making printed circuits, or in chemical milling, and as soldermasks. The compositions in layer form exhibit higher photographic speed, less oxygen sensitivity and improved development latitude over conventional photopolymerizable compositions. In addition, the compositions of this invention are developable in aqueous alkaline solutions and possess good coatability and laminatability properties. The photopolymerizable crystalline compositions are also useful in litho film elements, engineering drafting films, etc.

EXAMPLES

The invention is illustrated by the following examples wherein the parts and percentages are by weight. The molecular weights of polymeric compound in the specification and examples are weight average molecular weights ($\overline{M}_w$). The $\overline{M}_w$ of the polymers can be determined by using a light scattering technique using known standard samples, e.g., polystyrene, poly(methacrylic acid), poly(methyl methacrylate), etc. as known to those skilled in the art.

EXAMPLES 1 to 12

Aqueous carbonate developable photopolymerizable crystalline compositions were prepared:

| Ingredient | Amount (g) Example 1 | 2 |
|---|---|---|
| 1,2-Diphenoxyethane | — | 125.0 |
| Pentapolymer of octylacrylamide (40)/methyl methacrylate(35)/acrylic acid(16)/hydroxypropyl methacrylate(5)/-t-butylaminoethyl methacrylate (4); acid No. 118, Mw is 50,000 Tg approx. 120° C. | 261.5 | 136.5 |
| Terpolymer of ethyl acrylate(71)/methyl methacrylate(17)/acrylic acid(12); $M_w$ is 150,000 | 7.5 | 7.5 |
| Ethylene oxide condensate which is a nonionic detergent Merpol ® HC, E. I. du Pont de Nemours and Company, Wilmington, DE | 7.5 | 7.5 |
| Trimethylolpropane triacrylate | 135.0 | 135.0 |
| Michler's ketone: 4,4'bis-(dimethylamino)benzophenone | 0.5 | 0.5 |
| Benzophenone | 20.0 | 20.0 |
| Tri(p-N,N—dimethylaminophenyl) methane | 1.0 | 1.0 |
| Bis(2-o-chlorophenyl-4,5-diphenylimidazole) | 17.5 | 17.5 |
| Benzotriazole | 1.0 | 1.0 |
| Victoria ® green dye, C.I. Basic Green 4 | 0.35 | 0.35 |
| Polyethylene, high molecular weight, Microfine ® VIII gold | 45.0 | 45.0 |
| Methylene chloride | 1183.0 | 1183.0 |
| Methanol | 103.0 | 103.0 |

The coating compositions were coated at 6 ft/min (183 cm/min) on 0.001 inch (0.0025 cm) polyethylene terephthalate film support on a Talboy's coater by extrusion die to a thickness of 0.0013 inch (0.0033 cm) with a dryer temperature of 135° F. (57.2° C.) in a 12 foot (366 cm) dryer chamber. 0.001 inch (0.0025 cm) polyethylene cover sheets were laminated at 90 psi (6.32 kg/sq cm) at 160° F. (71.1° C.).

The films were laminated, after removal of the cover sheets to freshly scrubbed copper surfaced epoxy boards at 240° F. (115.6° C.), at 2 feet/minute (61 cm/minute), 40 psi (2.81 kg/sq cm). The laminated boards were exposed with a 2000 watt mercury photopolymer addalux lamp at a distance of 38 inches (96.5 cm) using an Ascor ® Light Integrator Platemaker model 1415-12 with a Berkey Ascor ® 1601-40 light source. The cover sheets were removed and the exposed laminates were developed in a Riston ® A processor (E. I. du Pont de Nemours and Company, Wilmington, DE) at 105° F. (40.6° C.) containing a 1% solution of sodium carbonate in tap water (pH about 10.4) for 2 times the time necessary to totally develop away a nonpolymerized sample. The processed results are:

| Example | Exposure (Units) | Development (Sec) | $\sqrt[6]{2}$ steps of polymer | Maximum Resolution lines/spaces (mils) |
|---|---|---|---|---|
| 1 (with cover sheet) | 10 | 40 | 21 | 2/4 |
|  | 13 | 40 | 23 | 2/4 |
|  | 13 | 60 | 23 | — |
|  | 13 | 80 | 22 | — |
|  | 13 | 100 | 17 | 3/4* |
|  | 13 | 120 | 13 | 3/4* |
| 1 (without cover sheet) | 13 | 40 | 10 | — |
| 2 (with cover sheet) | 13 | 40 | 27 | 5/6 |
|  | 10 | 40 | 22 | 2/4 |
|  | 10 | 60 | 22 | — |
|  | 10 | 100 | 20 | 2/4 |
|  | 10 | 120 | 19 | 2/4 |
| 2 (without cover sheet) | 10 | 40 | 15 | — |

*adhesion lost with finer lines

From the results it can be seen that the film of Example 2 has better development latitude and is less sensitive to oxygen during polymerization than the film of Example 1. The laminates are useful as resists for etching exposed copper.

EXAMPLES 3 to 5

Photopolymerizable crystalline compositions were prepared:

| Ingredient | Amount (g) Example | | |
|---|---|---|---|
|  | 3 | 4 | 5 |
| 1,2-Diphenoxyethane | 0.41 | — | — |
| Pentamethylbenzene | — | 0.41 | — |
| 1,4-Diethoxybenzene | — | — | 0.41 |
| Bis[2-o-chlorophenyl-4,5-bis-(m-methoxyphenyl)imidazole] | 0.04 | 0.04 | 0.04 |
| Bis(2-o-chlorophenyl-4,5-diphenylimidazole) | 0.04 | 0.04 | 0.04 |
| Visible sensitizer: 2-(9'-julolylidene)-5,7-dimethoxy-1-indanone | 0.03 | 0.03 | 0.03 |
| Tetraethylene glycol dimethacrylate | 0.15 | 0.15 | 0.15 |
| 2-mercaptobenzothiazole | 0.03 | 0.03 | 0.03 |
| Copolymer of 1:1 styrene/maleic anhydride partially esterified with isobutanol mixture; acid #190, $\overline{M}_w$ 10,000 | 0.15 | 0.15 | 0.15 |
| Pentapolymer described in Examples 1, 2 | 0.15 | 0.15 | 0.15 |
| Methylene chloride | 6.13 | 6.13 | 6.13 |
| Methanol | 0.53 | 0.53 | 0.53 |

The solutions were coated in a red light room with a 0.002 inch (0.0051 cm) doctor knife on resin subbed polyethylene terephthalate, air dried and a 0.001 inch (0.0025 cm) polyethylene terephthalate cover sheet laminated at 210°–215° F. (98.9°–101.7° C.) at 6 feet/minute (183 cm/minute). Films were exposed the next day for 20 seconds with a black light blue (BLB) Dylux ® lamp with the fluorescent bulbs 2 inches (5.08 cm) from the film through a Kodak 0.3 neutral density filter. The films were held down against a glass plate over the fluorescent bulbs with a pressure held frame. The films were developed after cover sheets were removed in a solution of 84 g potassium carbonate 1.5 hydrate, 5 g potassium carbonate and 1536 g distilled water at 22° C. followed by a 32° C. spray water rinse at 40 psi (2.81 kg/sq cm). Results of these experiments are:

| Example | Development time (sec) | $\sqrt[\#3]{2}$ steps of polymer |
|---|---|---|
| 3 | 6 | 20 |
|  | 12 | 16 |
| 4 | 6 | 16 |
|  | 12 | 16 |
| 5 | 6 | 18 |
|  | 12 | 15 |

1,2-diphenoxyethane of Example 3 gave the highest speed film.

EXAMPLES 6 to 8

Photopolymerizable crystalline compositions were prepared:

| Ingredient | Amount (g) Example | | |
|---|---|---|---|
|  | 6 | 7 | 8 |
| 1,2-Diphenoxyethane | 0.45 | 0.45 | 0.45 |
| Bis[2-o-chlorophenyl-4,5-bis-(m-methoxyphenyl)imidazole] | 0.02 | 0.02 | 0.02 |
| Bis[2-o-chlorophenyl-4,5-bis-(3',4'-dimethoxyphenyl)-imidazole] | 0.02 | 0.02 | 0.02 |
| 2-(9'-julolylidene)-5,6-dimethoxy-1-indanone | 0.02 | 0.02 | 0.02 |
| Tetraethylene glycol dimethacrylate | 0.15 | 0.15 | 0.15 |
| Polyethylene glycol, $\overline{M}_w$ range 190–210, Carbowax ® 200, Union Carbide, Danbury, CT | 0.02 | 0.02 | 0.02 |
| Pentapolymer described in Examples 1, 2 | 0.20 | 0.20 | 0.15 |
| Terpolymer described in Examples 1, 2 | 0.10 | — | — |
| Terpolymer of methyl methacrylate(70)/2-ethyl-hexyl acrylate(11)/acrylic acid (19), acid #123 | — | 0.10 | — |
| Terpolymer of methyl methacrylate(55)/ethyl acrylate(35)/acrylic acid (10); $\overline{M}_w$ is 50,000 | — | — | 0.15 |
| Triphenyl phosphite | 0.02 | 0.02 | 0.02 |
| Methylene chloride | 6.13 | 6.13 | 6.13 |
| Methanol | 0.53 | 0.53 | 0.53 |

The solutions were coated as described in Examples 3 to 5 and the films processed also as described in those examples. The results are:

| Example | Development time (sec) | $\sqrt[\#3]{2}$ steps of polymer |
|---|---|---|
| 6 | 6 | 22 |
|  | 12 | 21 |
| 7 | 6 | 22 |
|  | 12 | 21 |
| 8 | 6 | 20 |

-continued

| Example | Development time (sec) | $\sqrt[#3]{2}$ steps of polymer |
|---------|------------------------|-----------------------------------|
|         | 12                     | 22                                |

EXAMPLES 9 to 10

Photopolymerizable crystalline compositions were prepared.

| Ingredient | Amount (g) Example 9 | Amount (g) Example 10 |
|------------|---------------------|----------------------|
| 1,2-Diphenoxyethane | 0.45 | 0.47 |
| Bis[2-o-chlorophenyl-4,5-bis-(m-methoxyphenyl)imidazole] | 0.02 | 0.02 |
| Bis-[2-o-chlorophenyl-4,5-bis-(3',4'-dimethoxyphenyl)-imidazole] | 0.02 | 0.02 |
| 2-(9'-julolylidene)-5,6-dimethoxy-1-indanone | 0.02 | 0.02 |
| Tetraethylene glycol dimethacrylate | 0.15 | 0.15 |
| Polyethylene glycol, described in Examples 6 to 8 | 0.02 | 0.02 |
| Pentapolymer described in Examples 1, 2 | 0.20 | 0.20 |
| Terpolymer described in Examples 1, 2 | 0.10 | 0.10 |
| Triscyanoethylphosphine | 0.02 | — |
| Methylene chloride | 6.13 | 6.13 |
| Methanol | 0.53 | 0.53 |

The solutions were coated as described in Examples 3 to 5 except that the films were dried after coating in a 150° F. (65.6° C.) oven for 1 minute, 10 seconds. The films were laminated as described in Examples 3 to 5, and the films were processed as described in Examples 3 to 5 except that the exposures were through a Kodak #96 filter having an optical density of 1.0. The films were developed 6 seconds as described in Examples 3 to 5. In addition, the films were also exposed with a 2.5 kw Hg Xenon lamp with a 500 MM Bausch and Lomb monochromator set at 488 MM. The irradiance level was determined with a Y51 model 65 radiometer. The results of these experiments are:

| Results of Fluorescent BLB Exposure | |
|---|---|
| Example | $\sqrt[#3]{2}$ step of |
| 9 | 15 |
| 10 | 9 |

| Results of Exposure at 488 MM | |
|---|---|
| Example | mj/cm$^2$ to achieve $7\sqrt[3]{2}$ steps of polymer |
| 9 | 0.34 |
| 10 | 1.34 |

Film of Examples 9 and 10 was also prepared in which no cover sheet was laminated so the performance of imaging without a cover sheet could be determined. The films were processed as indicated for Examples 9 and 10 with cover sheets. The results are:

| Example | $\sqrt[#3]{2}$ steps of polymer |
|---------|-----------------------------------|
| 9 (with cover sheet) | 14 |
| 9 (without cover sheet) | 13 |
| 10 (with cover sheet) | 11 |
| 10 (without cover sheet) | 6 |

EXAMPLE 11

A photopolymerizable crystalline composition was prepared:

| Ingredient | Amount (g) |
|------------|------------|
| 1,2-Diphenoxyethane | 0.29 |
| Bis[2-o-chlorophenyl-4,5-bis-(m-methoxyphenyl)imidazole] | 0.04 |
| Bis(2-o-chlorophenyl-4,5-diphenylimidazole) | 0.04 |
| 2-(9'-julolylidene)-5,6-dimethoxy-1-indanone | 0.03 |
| Tetraethylene glycol dimethacrylate | 0.15 |
| 2-mercaptobenzoxazole | 0.03 |
| Terpolymer described in Examples 1, 2 | 0.05 |
| Roll milled dispersion of Sterling ® carbon black (45%) in polymer of Examples 1, 2 (55%) | 1.80 |
| Terpolymer of methyl methacrylate(48)/ethyl acrylate(27)/methacrylic acid(25); acid #170, Tg 75° C. | 0.05 |
| Triphenyl phosphite | 0.02 |
| Methylene chloride | 4.63 |
| Methanol | 0.53 |

The coating composition was coated on 0.004 inch (0.010 cm) polyethylene terephthalate film support with a 0.002 inch (0.0051 cm) doctor knife. No cover sheet was applied. The air dried film was exposed with the exposure source described in Examples 1 and 2 for 1 unit and three samples were developed for 6, 12 and 24 seconds as described in Examples 3 to 5. The 12 and 24 seconds developed samples resolved 5 to 95% dots on a 150 line screen. The 6 and 12 seconds developed samples had $5^3 \sqrt[3]{2}$ steps of polymer and the 24 seconds developed sample had $6^3 \sqrt[3]{2}$ steps of polymer. The film is a carbon black-pigmented litho film.

We claim:

1. A photopolymerizable crystalline composition soluble in aqueous alkaline solutions having a crystallinity index of at least 0.2 consisting essentially of
    (a) 10 to 40% by weight of at least one ethylenically unsaturated compound;
    (b) an initiating amount of at least one photoinitiator or photoinitiator system;
    (c) 20 to 40% by weight of at least one acidic polymeric binder; and
    (d) 20 to 50% by weight of a crystalline matrix forming compound having a melting point in the range of 50° to 200° C. selected from the group consisting of bibenzyl, biphenyl, pentamethylbenzene, 1,4-diethoxybenzene, 1,2-diphenoxyethane, octahydroanthracene, docosane, octacosane and, dotriacontane.

2. A photopolymerizable crystalline composition according to claim 1 wherein the crystalline matrix forming compound is diphenoxyethane.

3. A photopolymerizable crystalline composition according to claim 1 wherein the crystalline matrix forming compound is pentamethylbenzene.

4. A photopolymerizable crystalline composition according to claim 1 wherein an acidic polymeric binder is a pentapolymer of octylacrylamide/methyl methacrylate/acrylic acid/hydroxypropyl methacrylate/t-butylaminoethyl methacrylate.

5. A photopolymerizable crystalline composition according to claim 4 containing a second acidic polymeric binder taken from the group consisting of terpolymer of ethyl acrylate/methyl methacrylate/acrylic acid, copolymer of 1:1 styrene/maleic anhydride partially esterified with isobutanol mixture, terpolymer of methyl methacrylate/2-ethylhexyl acrylate/methacrylic acid and terpolymer of methyl methacrylate/ethyl acrylate/methacrylic acid.

6. A photopolymerizable crystalline composition according to claim 1 containing a phosphine compound.

7. A photopolymerizable crystalline composition according to claim 6 wherein the phosphine compound is triscyanoethylphosphine.

8. A photopolymerizable crystalline composition according to claim 1 wherein the photoinitiator is a hexaarylbiimidazole compound.

9. A photopolymerizable crystalline composition according to claim 8 containing 2-[9′(2′,3′,6′,7′-tetrahydro-1H,5H-benzo(ij) quinolylidene]-5,6-dimethoxy-1-indanone.

10. A photopolymerizable crystalline composition according to claim 1 in the form of a photoresist layer.

* * * * *